(12) United States Patent
Wang

(10) Patent No.: US 12,490,581 B2
(45) Date of Patent: Dec. 2, 2025

(54) OLED DISPLAY PANEL AND OLED DISPLAY PANEL MANUFACTURING METHOD

(71) Applicant: Wuhan China Star Optoelectronics Semiconductor Display Technology Co., Ltd., Wuhan (CN)

(72) Inventor: Junyuan Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/623,472

(22) PCT Filed: Dec. 20, 2021

(86) PCT No.: PCT/CN2021/139517
§ 371 (c)(1),
(2) Date: Jun. 15, 2023

(87) PCT Pub. No.: WO2023/103067
PCT Pub. Date: Jun. 15, 2023

(65) Prior Publication Data
US 2024/0049500 A1 Feb. 8, 2024

(30) Foreign Application Priority Data

Dec. 10, 2021 (CN) .......................... 202111505668.8

(51) Int. Cl.
*H10K 50/844* (2023.01)
*H10K 77/10* (2023.01)
*H10K 102/00* (2023.01)

(52) U.S. Cl.
CPC .......... *H10K 50/844* (2023.02); *H10K 77/10* (2023.02); *H10K 2102/351* (2023.02)

(58) Field of Classification Search
CPC . H10K 50/844; H10K 77/10; H10K 2102/351
(Continued)

(56) References Cited

U.S. PATENT DOCUMENTS

2019/0165312 A1 5/2019 Bae et al.
2019/0363296 A1* 11/2019 Wang ................. H10K 59/8731

FOREIGN PATENT DOCUMENTS

| CN | 110429193 A | 11/2019 |
|---|---|---|
| CN | 111354743 A | 6/2020 |

(Continued)

OTHER PUBLICATIONS

International Search Report in International application No. PCT/CN2021/139517,mailed on Jun. 29, 2022.
(Continued)

*Primary Examiner* — James R Greece
*Assistant Examiner* — Hana S Featherly
(74) *Attorney, Agent, or Firm* — PV IP PC; Wei Te Chung

(57) ABSTRACT

The present application provides an OLED display panel and an OLED display panel manufacturing method forming at least one crack-proof recess surrounding a display region on an array substrate. When the OLED display panel performs a laser cutting process to a cutting line region on the array substrate, cracks generated from the cutting line region is interrupted by the crack-proof recess and therefore cannot extend into a deep inside of a non-display region, and cannot further extend into the display region, which prevents a technical issue of a lowered yield rate due to extension of cracks into the display region.

20 Claims, 7 Drawing Sheets

(58) Field of Classification Search
USPC .......................................................... 313/500
See application file for complete search history.

(56) References Cited

FOREIGN PATENT DOCUMENTS

| | | |
|---|---|---|
| CN | 111403621 A | 7/2020 |
| CN | 111415965 A | 7/2020 |
| CN | 112736093 A | 4/2021 |
| CN | 112952017 A | 6/2021 |
| CN | 113130618 A | 7/2021 |

OTHER PUBLICATIONS

Written Opinion of the International Search Authority in International application No. PCT/CN2021/139517, mailed on Jun. 29, 2022.
Chinese Office Action issued in corresponding Chinese Patent Application No. 202111505668.8 dated Feb. 8, 2023, pp. 1-8.

* cited by examiner

OLED DISPLAY PANEL AND OLED DISPLAY PANEL MANUFACTURING METHOD

CROSS-REFERENCE TO RELATED APPLICATION

This application is a national phase application under 35 U.S.C. § 371 of PCT Application No. PCT/CN2021/139517, filed Dec. 20, 2021, which claims priority to Chinese Application No. 202111505668.8, filed Dec. 10, 2021, the contents of which are incorporated herein by reference in their entirety.

FIELD OF INVENTION

The present application relates to a field of display panels, especially to an organic light emitting diode (OLED) display panel manufacturing method and an OLED display panel.

BACKGROUND OF INVENTION

A conventional organic light emitting diode (OLED) has characteristics of self-luminescence, fast response speed, wide viewing angle, etc., and therefore has broad application prospects.

With reference to FIG. 1, a conventional OLED display panel 9 formed with a display region 900, a non-display region 901 surrounding the display region 900 and serving as a boundary of the display region 900, and a cutting line region 902 located outside the boundary and surrounding the non-display region 901. The cutting line region 902 is configured to allow a laser cutting device L' to perform laser cutting to the OLED display panel 9 for manufacturing a finished product of the OLED display panel 9.

With reference to FIG. 2, the above OLED display panel 9 is an inorganic/organic/inorganic lamination structure and comprises array substrate 90, inner inorganic layer 94, organic layer, and outer inorganic layer 96. An array control circuit layer is disposed on the array substrate 90. The inner inorganic, the organic layer, and the outer inorganic layer 96 are sequentially stacked on the array substrate 90. Furthermore, the organic layer are located in the display region 900.

The above inner inorganic layer 94 and the outer inorganic layer 96 are deposited on the array substrate 90 by using a common mask and by a chemical vapor deposition (CVD) process. Because the CVD process forms a certain gap between the substrate and the mask, and manufacturing precision of the mask is limited, a shadow effect of the inner inorganic layer 94 and the outer inorganic layer 96 occurs and results in the cutting line region 902 covered by a CVD film (inorganic layer). When a laser cutting is performed to the CVD film and the array substrate 90 of the OLED display panel 9 along the cutting line region 902, cracks C' are easily generated on the OLED display panel 9. Implementing an additional material bonding process to the OLED display panel 9 would make the crack C' further extend into the non-display region 901 of the OLED display panel 9 and even further extend into the display region 900, which results in failure of an encapsulation structure of the OLED display panel 9 to affect a production rate of the OLED display panel 9.

SUMMARY OF INVENTION

Technical Issue

An embodiment of the present application provides an organic light emitting diode (OLED) display panel and an OLED display panel manufacturing method to solve a technical issue that a conventional OLED display panel, when performing a laser cutting process to a cutting line region of an array substrate, easily generates cracks extending into a non-display region and even to a display region on the OLED display panel and results in a lowered yield rate.

Technical Solution

In an aspect, the embodiment of the present application provides an OLED display panel comprising a display region and a non-display region surrounding the display region, and the OLED display panel further comprising:

an array substrate comprising an underlay substrate and an array control circuit layer disposed on the underlay substrate, wherein the array control circuit layer comprises a barrier layer disposed on the underlay substrate;

at least one crack-proof recess formed on the array substrate, defined through the barrier layer and extending into the underlay substrate, wherein the crack-proof recess is located in the non-display region;

an inner inorganic layer formed on the array substrate, wherein at least one portion of the inner inorganic layer is formed in the crack-proof recess and is at least partially separated from a remaining portion of the inner inorganic layer;

an organic layer formed on the inner inorganic layer, wherein the organic layer is located in the display region; and an outer inorganic layer formed on the inner inorganic layer and covering the organic layer, wherein at least one portion of the outer inorganic layer is formed in the crack-proof recess is at least partially separated from a remaining portion of the outer inorganic layer.

In some embodiments of the present invention, the array substrate further comprises at least one retaining wall, the retaining wall is formed on the barrier layer of the array substrate and is located in the non-display region, and the crack-proof recess surrounds the retaining wall; and the inner inorganic layer covers the retaining wall.

In some embodiments of the present invention, a distance between the retaining wall and the crack-proof recess is greater than or equal to 5 um.

In some embodiments of the present invention, a distance between the crack-proof recess and an edge of the non-display region away from the display region is greater than a distance between the crack-proof recess and an adjacent edge of the display region.

In some embodiments of the present invention, a width of an opening end of the crack-proof recess near the barrier layer is less than a width of a bottom end of the crack-proof recess away from the barrier layer.

In some embodiments of the present invention, the crack-proof recess cross-sectional contour is trapezoidal, a height of a cross-sectional contour of the crack-proof recess is greater than or equal to 2 um, and a minimum width W of the cross-sectional contour of the crack-proof recess is from 10 um to 30 um, an included angle θ between a leg of the cross-sectional contour of the crack-proof recess and a level line is from 0° to 90°.

In some embodiments of the present invention, the barrier layer is an inorganic film layer, the underlay substrate comprises an organic film layer, and the crack-proof recess extends through the inorganic film layer and extends into the organic film layer.

In some embodiments of the present invention, the at least one portion of the inner inorganic layer formed in the crack-proof recess is completely separated from the remaining portion of the inner inorganic layer.

In some embodiments of the present invention, the at least one portion of the outer inorganic layer formed in the crack-proof recess is completely separated from the remaining portion of the outer inorganic layer.

In another aspect, the embodiment of the present application provides an OLED display panel manufacturing method, wherein an OLED display panel comprises a display region and a non-display region surrounding the display region, and the method comprises:

- an array substrate forming step comprising disposing an array control circuit layer on an underlay substrate to form an array substrate, wherein the array control circuit layer comprises a barrier layer disposed on the underlay substrate;
- a crack-proof recess forming step comprising forming at least one crack-proof recess, defined through the barrier layer and extending into the underlay substrate, on the array substrate, wherein the crack-proof recess is located in the non-display region;
- an inner inorganic layer forming step comprising forming an inner inorganic layer on the array substrate, wherein at least one portion of the inner inorganic layer is formed in the crack-proof recess and is at least partially separated from a remaining portion of the inner inorganic layer;
- an organic layer forming step comprising forming an organic layer on the inner inorganic layer, wherein the organic layer is located in the display region; and
- an outer inorganic layer forming step comprising forming an outer inorganic layer, covering the organic layer, on the inner inorganic layer, wherein at least one portion of the outer inorganic layer is formed in the crack-proof recess and is at least partially separated from a remaining portion of the outer inorganic layer.

In another aspect, the embodiment of the present application provides an OLED display panel, comprising a display region and a non-display region surrounding the display region, the OLED display panel further comprising:

- an array substrate comprising an underlay substrate and an array control circuit layer disposed on the underlay substrate, wherein the array control circuit layer comprises a barrier layer disposed on the underlay substrate;
- at least one crack-proof recess formed on the array substrate, defined through the barrier layer and extending into the underlay substrate, wherein the crack-proof recess is located in the non-display region;
- an inner inorganic layer formed on the array substrate, wherein at least one portion of the inner inorganic layer is formed in the crack-proof recess and is at least partially separated from a remaining portion of the inner inorganic layer;
- an organic layer formed on the inner inorganic layer, wherein the organic layer is located in the display region; and
- an outer inorganic layer formed on the inner inorganic layer and covering the organic layer, wherein at least one portion of the outer inorganic layer is formed in the crack-proof recess is at least partially separated from a remaining portion of the outer inorganic layer;
- wherein the array substrate further comprises at least one retaining wall, the retaining wall is formed on the barrier layer of the array substrate and is located in the non-display region, and the crack-proof recess surrounds the retaining wall;
- wherein the inner inorganic layer covers the retaining wall;
- wherein a distance between the crack-proof recess and an edge of the non-display region away from the display region is greater than a distance between the crack-proof recess and an adjacent edge of the display region.

In some embodiments of the present invention, a distance between the retaining wall and the crack-proof recess is greater than or equal to 5 um.

In some embodiments of the present invention, a width of an opening end of the crack-proof recess near the barrier layer is less than a width of a bottom end of the crack-proof recess away from the barrier layer.

In some embodiments of the present invention, the crack-proof recess cross-sectional contour is trapezoidal, a height of a cross-sectional contour of the crack-proof recess is greater than or equal to 2 um, and a minimum width W of the cross-sectional contour of the crack-proof recess is from 10 um to 30 um, an included angle $\theta$ between a leg of the cross-sectional contour of the crack-proof recess and a level line is from 0° to 90°.

In some embodiments of the present invention, the barrier layer is an inorganic film layer, the underlay substrate comprises an organic film layer, and the crack-proof recess extends through the inorganic film layer and extends into the organic film layer.

In some embodiments of the present invention, the at least one portion of the inner inorganic layer formed in the crack-proof recess is completely separated from the remaining portion of the inner inorganic layer.

In some embodiments of the present invention, the at least one portion of the outer inorganic layer formed in the crack-proof recess is completely separated from the remaining portion of the outer inorganic layer.

In some embodiments of the present invention, a distance between the retaining wall and the crack-proof recess is greater than or equal to 5 um;

- a width of an opening end of the crack-proof recess near the barrier layer is less than a width of a bottom end of the crack-proof recess away from the barrier layer; and
- the crack-proof recess cross-sectional contour is trapezoidal, a height of a cross-sectional contour of the crack-proof recess is greater than or equal to 2 um, and a minimum width W of the cross-sectional contour of the crack-proof recess is from 10 um to 30 um, an included angle $\theta$ between a leg of the cross-sectional contour of the crack-proof recess and a level line is from 0° to 90°.

In some embodiments of the present invention, the barrier layer is an inorganic film layer, the underlay substrate comprises an organic film layer, and the crack-proof recess extends through the inorganic film layer and extends into the organic film layer.

In some embodiments of the present invention, the at least one portion of the inner inorganic layer formed in the crack-proof recess is completely separated from the remaining portion of the inner inorganic layer; and

- the at least one portion of the outer inorganic layer formed in the crack-proof recess is completely separated from the remaining portion of the outer inorganic layer.

Advantages

The present application at least comprises advantages as follows:

The OLED display panel and the OLED display panel manufacturing method provided by the present application form at least one crack-proof recess surrounding the display region on the array substrate. When the OLED display panel performs a laser cutting process to the array substrate, cracks generated from the cutting line region is interrupted by the crack-proof recess and therefore cannot extend into deep inside of the non-display region, and cannot further extend into the display region such that the present application prevents the technical issue that a conventional OLED display panel, when performing a laser cutting process to a cutting line region of an array substrate, easily generates cracks extending into a non-display region and even to a display region on the OLED display panel and results in a lowered yield rate.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
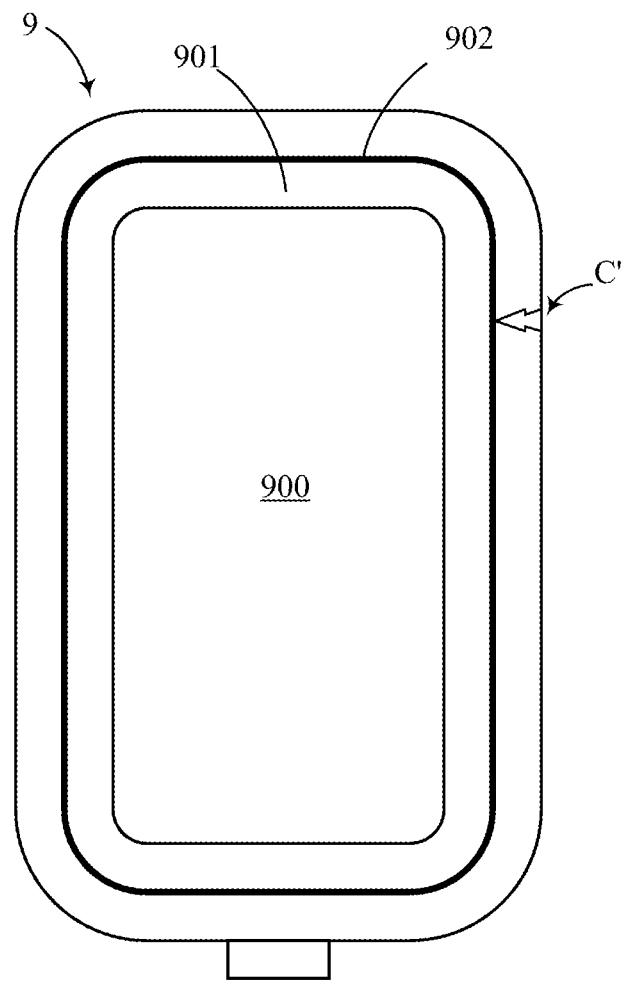
FIG. 1 is a top view of a conventional organic light emitting diode (OLED) display panel.
Figure 2:
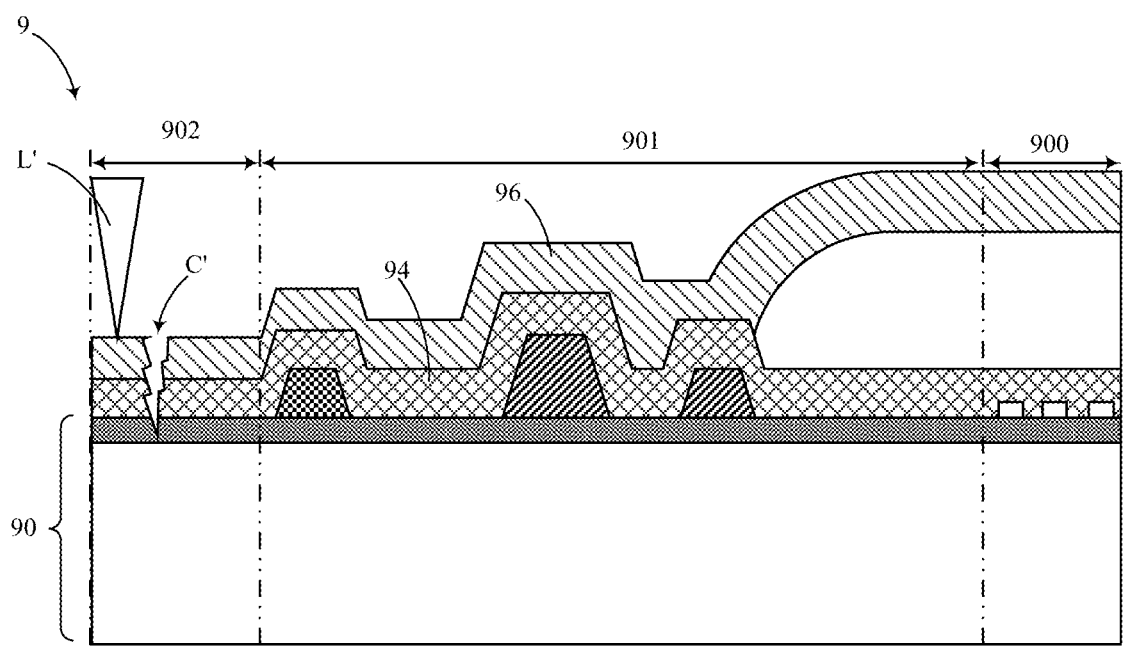
FIG. 2 is a partial section view of a conventional OLED display panel.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

In addition, it should be understood that the specific embodiments described here are only used to illustrate and explain the present application, and are not used to limit the present application. In the present application, the used orientation terminologies such as "upper" and "lower", when are not specified to the contrary explanation, usually refer to the upper and lower states of the device in actual use or working conditions, specifically according to the direction of the figures in the drawings. Furthermore, "inner" and "outer" refer to the outline of the device.

Figure 4:
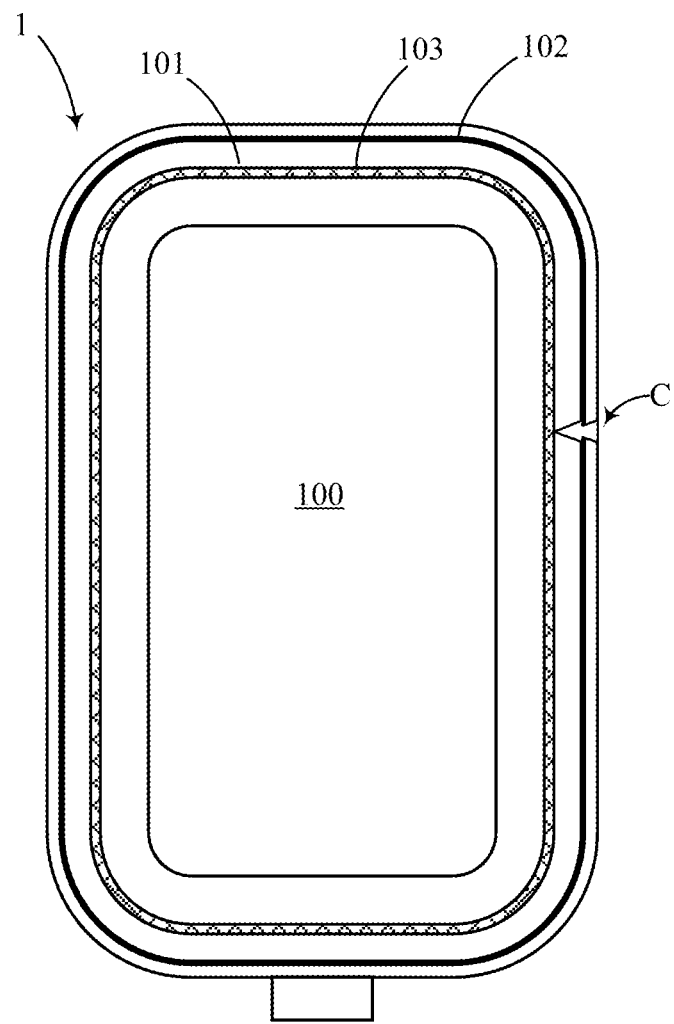
FIG. 4 is a top view of the OLED display panel the provided by the embodiment of the present application.
Figure 5:
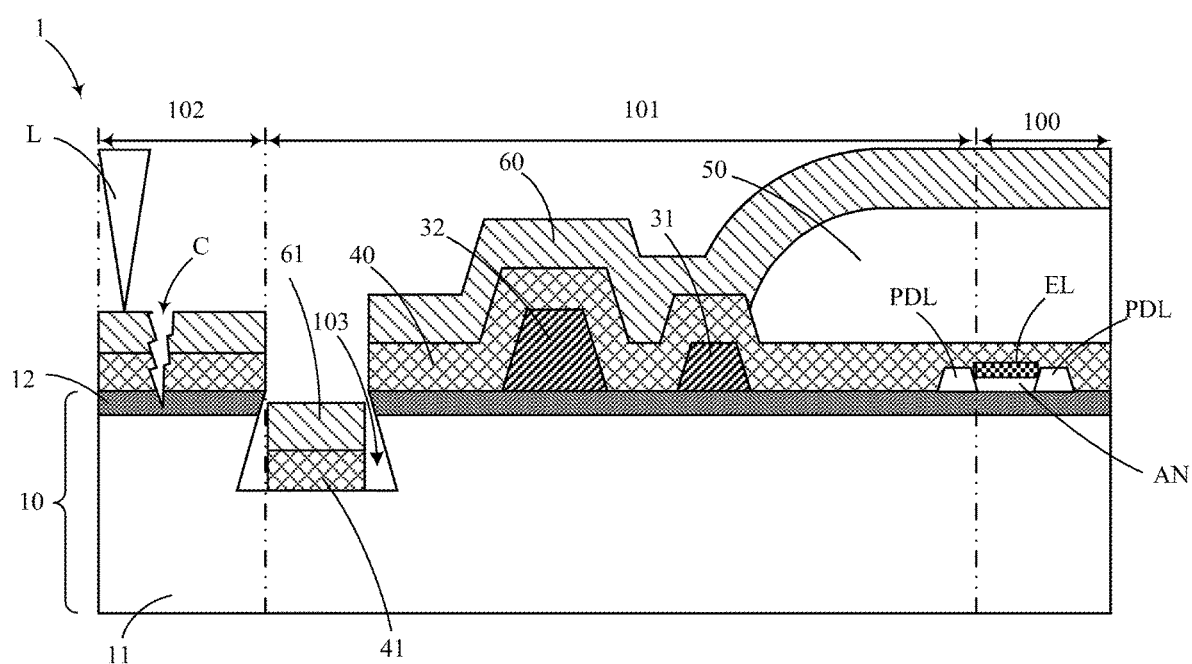
FIG. 5 is a partial section view of the OLED display panel provided by the embodiment of the present application.

With reference to FIGS. 4 and 5, an OLED display panel 1 provided by the embodiment of the present application comprises: an array substrate 10, at least one crack-proof recess 103, an inner inorganic layer 40, an organic layer 50, and an outer inorganic layer 60.

The array substrate 10 comprises an underlay substrate 11 and an array control circuit layer disposed on the underlay substrate 11, wherein the array substrate 10 is defined with a display region 100 and a non-display region 101 surrounding the display region 100. The non-display region 101 comprises a cutting line region 102 disposed on an edge of the non-display region 101 away from display region 100. The array control circuit layer comprises a barrier layer 12 disposed on the underlay substrate 11.

In particular, the cutting line region 102 can be an ink line printed on the array substrate 10 by a color ink in advance, and can be a shallow notch structure formed in the array substrate 10 by a cutting device in advance. In particular, the array control circuit layer of the array substrate 10 comprises a pixel definition layer PDL and an anode layer AN disposed on the barrier layer 12. The cutting line region 102 is mainly configured to allow a laser cutting device L to cut the array substrate 10 along the cutting line region 102 to form a finished product of the OLED display panel 1. In actual applications, after the cutting line region 102 is cut, only a portion in the non-display region 101 is left, and some other cut portion is not shown in FIG. 5.

The at least one crack-proof recess 103 is formed on the array substrate 10, extends through the barrier layer 12 and extends into the underlay substrate 11. The crack-proof recess 103 surrounds the display region 100 and is located in the non-display region 101. In particular, the crack-proof recess 103 is configured to block cracks C generated when the laser cutting device L cutting the array substrate 10 along the cutting line region 102 to prevent an issue of the cracks C passing through the crack-proof recess 103 and extending deeply into the non-display region 101 and even further extending into the display region 100 to cause damages to the display panel.

Figure 6:
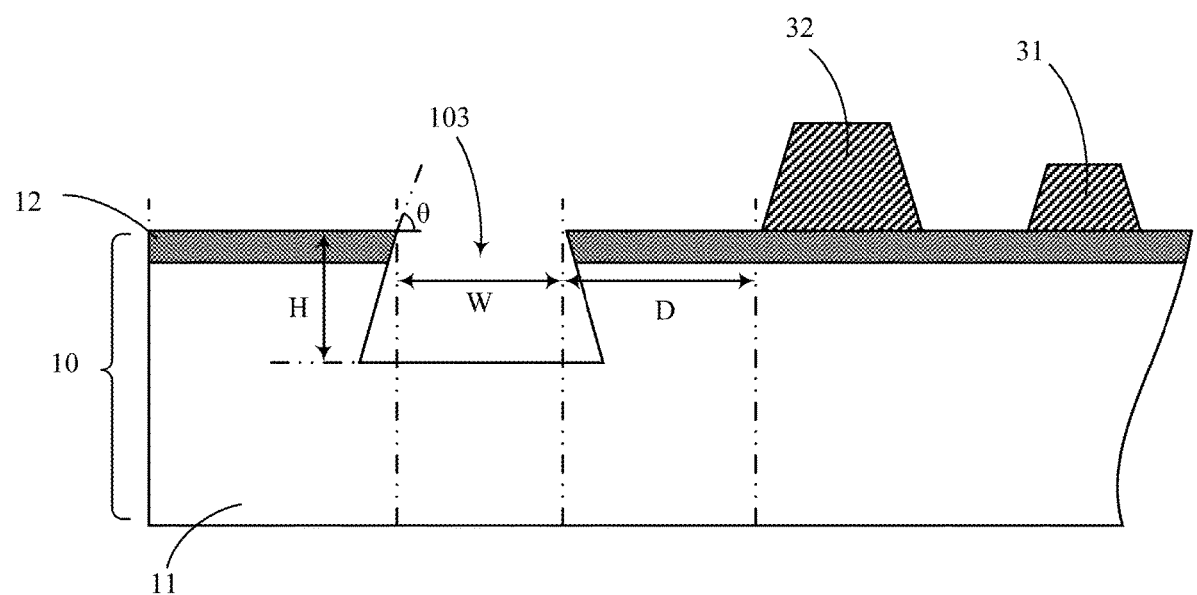
FIG. 6 is an enlarged partial section view of the OLED display panel provided by the embodiment of the present application, wherein an inner inorganic layer and an outer inorganic layer are omitted.

With reference to FIG. 6, a cross-sectional contour of the crack-proof recess 103 can be trapezoidal such that a width of an opening of the crack-proof recess 103 near the barrier layer 12 is less than a width of a bottom end the crack-proof recess 103 away from the barrier layer 12. In the meantime, a height H of the trapezoidal cross-sectional contour is greater than or equal to 2 um, a minimum width W of the trapezoidal cross-sectional contour (i.e., the width of the opening end) is a range from 10 um to 30 um, an included angle $\theta$ between a leg of the trapezoidal cross-sectional contour and a level line is an angular range from 0° to 90°. The above value ranges can make the crack-proof recess 103 to have a better crack-proof effect. Furthermore, a depth of the crack-proof recess 103 in the array substrate 10 can be greater than a depth of the crack-proof recess 103 in the barrier layer 12 to further improve the crack-proof effect of the crack-proof recess 103 provided to the array substrate 10.

Figure 7:
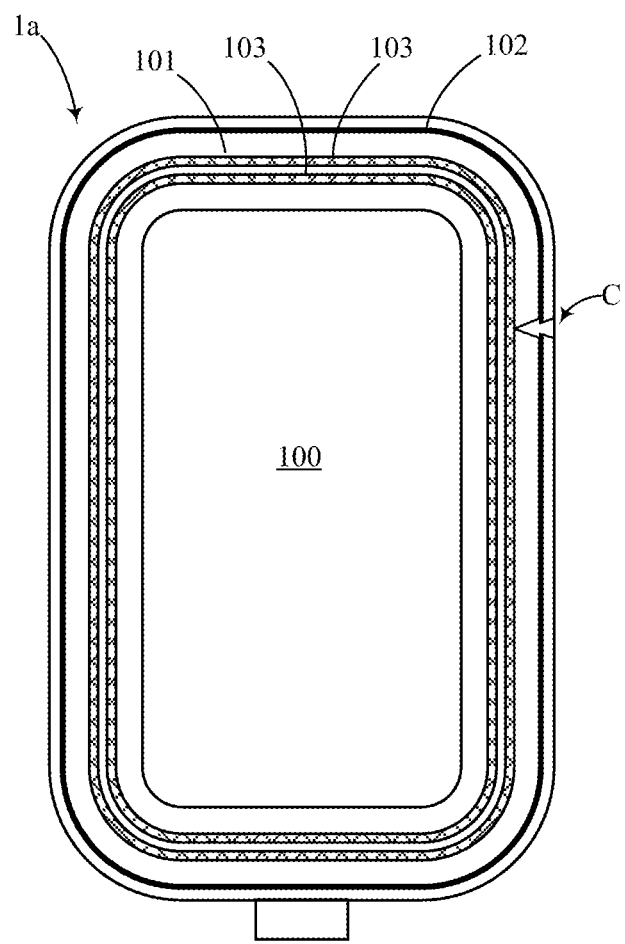
FIG. 7 is a partial section view of the OLED display panel provided by another embodiment of the present application.

With reference to FIG. 7, in an embodiment of the present invention, the crack-proof recess 103 is two or more, and concentrically surrounds the display region 100 to improve a crack-proof effect of the display panel.

Furthermore, after the crack-proof recess forming step S02, a fine metal mask (FMM) and an evaporation can be further used to disposed a red (R), blue (G), or green (B) light emitting material EL above the anode layer AN of the pixel region. Alternatively, The red (R), blue (G), or green (B) light emitting material EL is printed above the anode layer AN of the pixel region.

The inner inorganic layer 40 is formed on the array substrate wherein at least one portion 41 of the inner inorganic layer 40 is formed in the crack-proof recess 103 and is at least partially separated from a remaining portion of the inner inorganic layer 40. In particular, the inner inorganic layer 40 can be formed by depositing a water repellent material such as silicon nitride (SiNx) or silicon oxynitride (SiONx) on the array substrate 10 by a plasma enhanced chemical vapor deposition (PECVD) process.

The organic layer 50 is formed on the inner inorganic layer 40. The organic layer 50 is located in the display region 100. In particular, the organic layer 50 is usually formed by an inkjet printing (IJP) process.

The outer inorganic layer 60 is formed on the inner inorganic layer 40 and covers the organic layer 50. At least one portion 61 of the outer inorganic layer 60 is formed in the crack-proof recess 103 is at least partially separated from a remaining portion of the outer inorganic layer 60. In particular, the outer inorganic layer 60 be formed by depositing a water repellent material such as silicon nitride (SiNx) or silicon oxynitride (SiONx) on the inner inorganic layer 40 and the organic layer 50 by a plasma enhanced chemical vapor deposition (PECVD) process.

In an embodiment of the present application, the array substrate 10 further comprises at least one retaining wall 31, 32, the retaining wall 31, 32 is formed on the barrier layer 12 of the array substrate 10 and is located in the non-display region 101, and the crack-proof recess 103 surrounds the retaining wall. The inner inorganic layer 40 covers the retaining wall 31, 32. the retaining wall 31, 32 can serve as a boundary of the organic layer 50.

In an embodiment of the present application, the retaining wall 31, 32 can be a plural, and a distance D between one of the retaining walls 31, 32 most near the crack-proof recess 103 and the crack-proof recess 103 is greater than or equal to 5 um.

In an embodiment of the present application, a height of the retaining wall 32 away from the display region 100 must be greater than a height of the retaining wall 31 near the display region 100.

In an embodiment of the present application, a distance between the crack-proof recess 103 and an edge of the non-display region 101 away from display region 100 is greater than a distance between the crack-proof recess 103 and an adjacent edge of the display region 100.

In an embodiment of the present application, the barrier layer 12 is an inorganic film layer, the underlay substrate 11 comprises an organic film layer, the crack-proof recess 103 extends through the inorganic film layer and extends into the organic film layer.

In an embodiment of the present application, the at least one portion 41 of the inner inorganic layer 40 formed in the crack-proof recess 103 and is completely separated from a remaining portion of the inner inorganic layer 40. The completely separated portion of the inner inorganic layer 40 in the crack-proof recess 103 can effectively block the cracks from extending into the display region 100 along the inner inorganic layer 40.

In an embodiment of the present application, the at least one portion 61 of the outer inorganic layer 60 formed in the crack-proof recess 103 is completely separated from the remaining portion of the outer inorganic layer 60. The portion of the crack-proof recess 103 completely separated in the outer inorganic layer 60 can effectively block the cracks from extending along the outer inorganic layer 60 into the display region 100.

Figure 3:
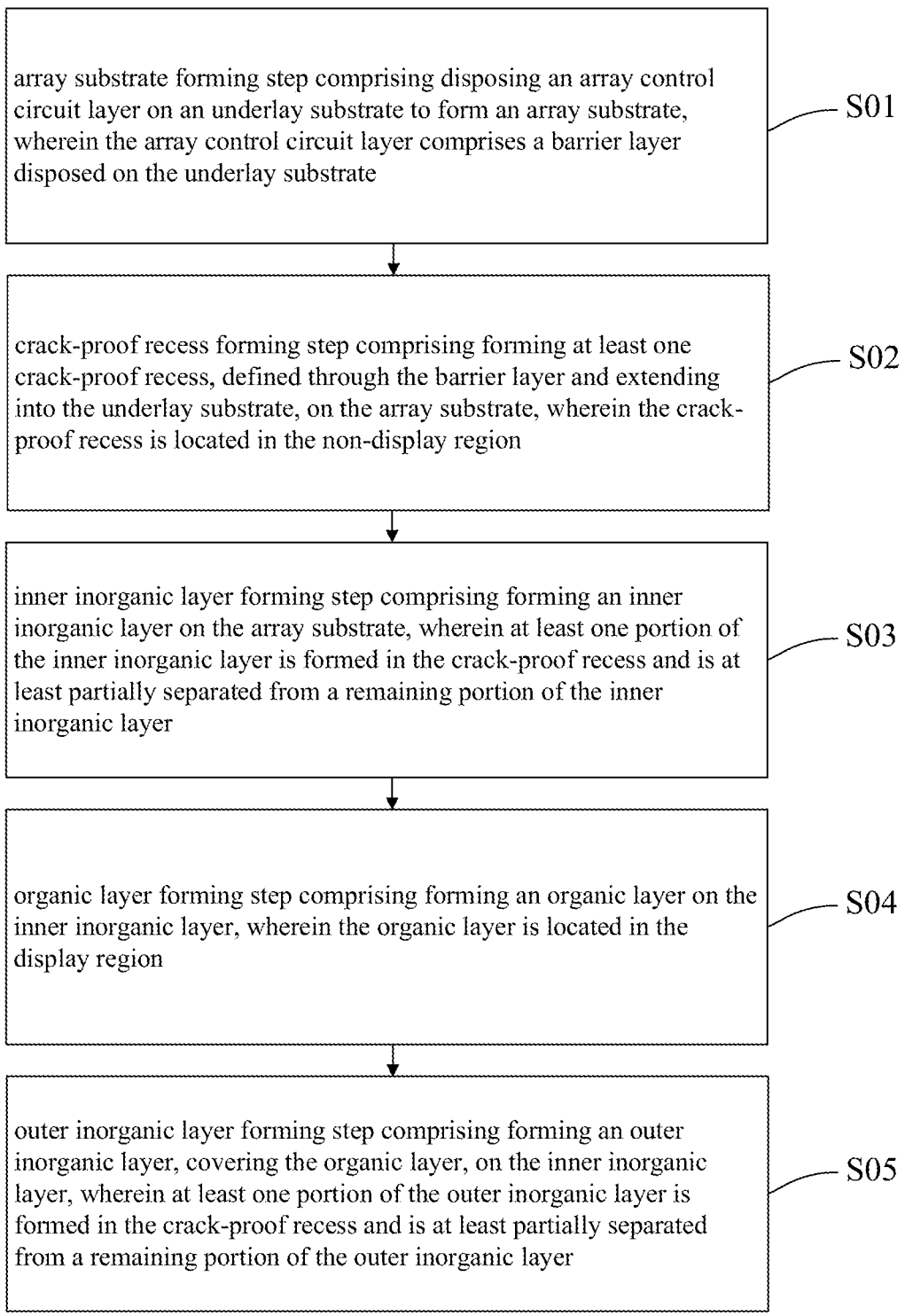
FIG. 3 is a flowchart of an OLED display panel manufacturing method provided by an embodiment of the present application.

With reference to FIGS. 3 to 5, the embodiment of the present application provides an OLED display panel manufacturing method comprises: an array substrate forming step S01, a crack-proof recess forming step S02, an inner inorganic layer forming step S03, an organic layer forming step S04, and an outer inorganic layer forming step S05.

The array substrate forming step S01 comprises disposing an array control circuit layer on an underlay substrate 11 to form an array substrate 10, wherein the array control circuit layer comprises a barrier layer 12 disposed on the underlay substrate 11.

In particular, the cutting line region 102 can be an ink line printed on the array substrate 10 by a color ink in advance, and can be a shallow notch structure formed in the array substrate 10 by a cutting device in advance. In particular, the array control circuit layer of the array substrate 10 comprises a pixel definition layer PDL and an anode layer AN disposed on the barrier layer 12. The cutting line region 102 is mainly configured to allow a laser cutting device L to cut the array substrate 10 along the cutting line region 102 to form a finished product of the OLED display panel 1.

The crack-proof recess forming step S02 comprises forming at least one crack-proof recess 103, extending through and the barrier layer 12 and extending into the underlay substrate 11, on the array substrate 10, wherein the crack-proof recess 103 surrounds the display region 100 and is located in the non-display region 101. Furthermore, the crack-proof recess forming step S02 can be completed by a lithography process. In particular, the crack-proof recess 103 is configured to block cracks C generated when the laser cutting device L cutting the array substrate 10 along the cutting line region 102 to prevent an issue of the cracks C passing through the crack-proof recess 103 and extending deeply into the non-display region 101 and even further extending into the display region 100 to cause damages to the display panel.

With reference to FIG. 6, a cross-sectional contour of the crack-proof recess 103 can be trapezoidal such that a width of an opening of the crack-proof recess 103 near the barrier layer 12 is less than a width of a bottom end the crack-proof recess 103 away from the barrier layer 12. In the meantime, a height H of the trapezoidal cross-sectional contour is greater than or equal to 2 um, a minimum width W of the trapezoidal cross-sectional contour (i.e., the width of the opening end) is a range from 10 um to 30 um, an included angle θ between a leg of the trapezoidal cross-sectional contour and a level line is an angular range from 0° to 90°. The above value ranges can make the crack-proof recess 103 to have a better crack-proof effect. Furthermore, a depth of the crack-proof recess 103 in the array substrate 10 can be greater than a depth of the crack-proof recess 103 in the barrier layer 12 to further improve the crack-proof effect of the crack-proof recess 103 provided to the array substrate 10.

With reference to FIG. 7, in an embodiment of the present invention, the crack-proof recess 103 is two or more, and concentrically surrounds the display region 100 to improve a crack-proof effect of the display panel.

Furthermore, after the crack-proof recess forming step S02, a fine metal mask (FMM) and an evaporation can be further used to disposed a red (R), blue (G), or green (B)

light emitting material EL above the anode layer AN of the pixel region. Alternatively, The red (R), blue (G), or green (B) light emitting material EL is printed above the anode layer AN of the pixel region.

The inner inorganic layer forming step S03 comprises forming an inner inorganic layer 40 on the array substrate 10, wherein at least one portion 41 of the inner inorganic layer 40 is formed in the crack-proof recess 103 and is at least partially separated from a remaining portion of the inner inorganic layer 40. In particular, the inner inorganic layer 40 can be formed by depositing a water repellent material such as silicon nitride (SiNx) or silicon oxynitride (SiONx) on the array substrate 10 by a plasma enhanced chemical vapor deposition (PECVD) process.

The organic layer forming step S04 comprises forming an organic layer 50 on the inner inorganic layer 40, wherein the organic layer 50 is located in the display region 100. In particular, the organic layer 50 is usually formed by an inkjet printing (IJP) process.

The outer inorganic layer forming step S05 comprises forming an outer inorganic layer 60, covering the organic layer 50, on the inner inorganic layer 40. At least one portion 61 of the outer inorganic layer 60 is formed in the crack-proof recess 103 is at least partially separated from a remaining portion of the outer inorganic layer 60. In particular, the outer inorganic layer 60 can be formed by depositing a water repellent material such as silicon nitride (SiNx) or silicon oxynitride (SiONx) on the inner inorganic layer and the organic layer 50 by a plasma enhanced chemical vapor deposition (PECVD) process.

Furthermore, the above inner inorganic layer forming step S03, organic layer forming step S04, and outer inorganic layer forming step S05 commonly constitute a thin film encapsulation (TFE) step.

The inner inorganic layer forming step S03 comprises forming an inner inorganic layer 40 on the array substrate 10, wherein at least one portion 41 of the inner inorganic layer 40 is formed in the crack-proof recess 103 and is completely separated from a remaining portion of the inner inorganic layer 40. The completely separated portion of the inner inorganic layer 40 in the crack-proof recess 103 can effectively block the cracks from extending into the display region 100 along the inner inorganic layer 40.

In an embodiment of the present application, the outer inorganic layer forming step S05, comprises forming an outer inorganic layer covering the organic layer 50, on the inner inorganic layer 40, wherein at least one portion 61 of the outer inorganic layer 60 is formed in the crack-proof recess 103 and is completely separated from the remaining portion of the outer inorganic layer 60. The portion of the crack-proof recess 103 completely separated in the outer inorganic layer 60 can effectively block the cracks from extending along the outer inorganic layer 60 into the display region 100.

In an embodiment of the present application, a distance between the crack-proof recess 103 and an edge of the non-display region 101 away from display region 100 is greater than a distance between the crack-proof recess 103 and an adjacent edge of the display region 101.

In an embodiment of the present application, the array substrate forming step S01 further comprises forming at least one retaining wall 31, 32, located in the non-display region 101, on the barrier layer 12 of the array substrate 10, wherein the crack-proof recess 103 surrounds the retaining wall 31, 32. The inner inorganic layer 40 covers the retaining wall 31, 32. the retaining wall 31, 32 can serve as a boundary of the organic layer 50.

In an embodiment of the present application, the retaining wall 31, 32 can be a plural, and a distance D between the retaining wall 31, 32 most near the crack-proof recess 103 and the crack-proof recess 103 is greater than or equal to 5 um.

In an embodiment of the present application, a distance between the crack-proof recess 103 and the cutting line region 102 is greater than a distance between the crack-proof recess 103 and an adjacent edge of the display region 101.

In an embodiment of the present application, a height of the retaining wall 32 away from the display region 100 must be greater than a height of the retaining wall 31 near the display region 100.

The present application at least comprises advantages as follows:

The OLED display panel 1 and the OLED display panel manufacturing method provided by the present application form at least one crack-proof recess 103 surrounding the display region 100 on the array substrate 10. When the OLED display panel 1 performs a laser cutting process to the array substrate 10, cracks C generated from the cutting line region 102 is interrupted by the crack-proof recess 103 and therefore cannot extend into deep inside of the non-display region 101, and cannot further extend into the display region 100 such that the present application prevents the technical issue that a conventional OLED display panel 1, when performing a laser cutting process to a cutting line region 102 of an array substrate 10, easily generates cracks C extending into a non-display region 101 and even to a display region 100 on the OLED display panel 1 and results in a lowered yield rate.

The OLED display panel manufacturing method and the OLED display panel 1 provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present the idea of invention, changes will be made in specific embodiment and application. In summary, the contents of this specification should not be construed as limiting the present application.

What is claimed is:

1. An organic light emitting diode (OLED) display panel, comprising a display region and a non-display region surrounding the display region, and the OLED display panel further comprising:

an array substrate comprising an underlay substrate and an array control circuit layer disposed on the underlay substrate, wherein the array control circuit layer comprises a barrier layer disposed on the underlay substrate;

at least one crack-proof recess formed on the array substrate, defined through the barrier layer and extending into the underlay substrate, wherein the crack-proof recess is located in the non-display region;

an inner inorganic layer formed on the array substrate, wherein at least one portion of the inner inorganic layer is formed in the crack-proof recess and is at least partially separated from a remaining portion of the inner inorganic layer;

an organic layer formed on the inner inorganic layer, wherein the organic layer is located in the display region; and an outer inorganic layer formed on the inner inorganic layer and covering the organic layer, wherein at least one portion of the outer inorganic layer is formed in the crack-proof recess is at least partially separated from a remaining portion of the outer inorganic layer.

2. The OLED display panel according to claim 1, wherein the array substrate further comprises at least one retaining wall, the retaining wall is formed on the barrier layer of the array substrate and is located in the non-display region, and the crack-proof recess surrounds the retaining wall; and the inner inorganic layer covers the retaining wall.

3. The OLED display panel according to claim 2, wherein a distance between the retaining wall and the crack-proof recess is greater than or equal to 5 um.

4. The OLED display panel according to claim 2, wherein a distance between the crack-proof recess and an edge of the non-display region away from the display region is greater than a distance between the crack-proof recess and an adjacent edge of the display region.

5. The OLED display panel according to claim 1, wherein a width of an opening end of the crack-proof recess near the barrier layer is less than a width of a bottom end of the crack-proof recess away from the barrier layer.

6. The OLED display panel according to claim 5, wherein the crack-proof recess cross-sectional contour is trapezoidal, a height of a cross-sectional contour of the crack-proof recess is greater than or equal to 2 um, and a minimum width W of the cross-sectional contour of the crack-proof recess is from 10 um to 30 um, an included angle θ between a leg of the cross-sectional contour of the crack-proof recess and a level line is from 0° to 90°.

7. The OLED display panel according to claim 1, wherein the barrier layer is an inorganic film layer, the underlay substrate comprises an organic film layer, and the crack-proof recess extends through the inorganic film layer and extends into the organic film layer.

8. The OLED display panel according to claim 1, wherein the at least one portion of the inner inorganic layer formed in the crack-proof recess is completely separated from the remaining portion of the inner inorganic layer.

9. The OLED display panel according to claim 8, wherein the at least one portion of the outer inorganic layer formed in the crack-proof recess is completely separated from the remaining portion of the outer inorganic layer.

10. An organic light emitting diode (OLED) display panel manufacturing method, wherein an OLED display panel comprises a display region and a non-display region surrounding the display region, and the method comprises:

an array substrate forming step comprising disposing an array control circuit layer on an underlay substrate to form an array substrate, wherein the array control circuit layer comprises a barrier layer disposed on the underlay substrate;

a crack-proof recess forming step comprising forming at least one crack-proof recess, defined through the barrier layer and extending into the underlay substrate, on the array substrate, wherein the crack-proof recess is located in the non-display region;

an inner inorganic layer forming step comprising forming an inner inorganic layer on the array substrate, wherein at least one portion of the inner inorganic layer is formed in the crack-proof recess and is at least partially separated from a remaining portion of the inner inorganic layer;

an organic layer forming step comprising forming an organic layer on the inner inorganic layer, wherein the organic layer is located in the display region; and an outer inorganic layer forming step comprising forming an outer inorganic layer, covering the organic layer, on the inner inorganic layer, wherein at least one portion of the outer inorganic layer is formed in the crack-proof recess and is at least partially separated from a remaining portion of the outer inorganic layer.

11. An organic light emitting diode (OLED) display panel, comprising a display region and a non-display region surrounding the display region, the OLED display panel further comprising:

an array substrate comprising an underlay substrate and an array control circuit layer disposed on the underlay substrate, wherein the array control circuit layer comprises a barrier layer disposed on the underlay substrate;

at least one crack-proof recess formed on the array substrate, defined through the barrier layer and extending into the underlay substrate, wherein the crack-proof recess is located in the non-display region;

an inner inorganic layer formed on the array substrate, wherein at least one portion of the inner inorganic layer is formed in the crack-proof recess and is at least partially separated from a remaining portion of the inner inorganic layer;

an organic layer formed on the inner inorganic layer, wherein the organic layer is located in the display region; and an outer inorganic layer formed on the inner inorganic layer and covering the organic layer, wherein at least one portion of the outer inorganic layer is formed in the crack-proof recess is at least partially separated from a remaining portion of the outer inorganic layer;

wherein the array substrate further comprises at least one retaining wall, the retaining wall is formed on the barrier layer of the array substrate and is located in the non-display region, and the crack-proof recess surrounds the retaining wall;

wherein the inner inorganic layer covers the retaining wall;

wherein a distance between the crack-proof recess and an edge of the non-display region away from the display region is greater than a distance between the crack-proof recess and an adjacent edge of the display region.

12. The OLED display panel according to claim 11, wherein a distance between the retaining wall and the crack-proof recess is greater than or equal to 5 um.

13. The OLED display panel according to claim 11, wherein a width of an opening end of the crack-proof recess near the barrier layer is less than a width of a bottom end of the crack-proof recess away from the barrier layer.

14. The OLED display panel according to claim 11, wherein the crack-proof recess cross-sectional contour is trapezoidal, a height of a cross-sectional contour of the crack-proof recess is greater than or equal to 2 um, and a minimum width W of the cross-sectional contour of the crack-proof recess is from 10 um to 30 um, an included angle θ between a leg of the cross-sectional contour of the crack-proof recess and a level line is from 0° to 90°.

15. The OLED display panel according to claim 11, wherein the barrier layer is an inorganic film layer, the underlay substrate comprises an organic film layer, and the crack-proof recess extends through the inorganic film layer and extends into the organic film layer.

16. The OLED display panel according to claim 11, wherein the at least one portion of the inner inorganic layer formed in the crack-proof recess is completely separated from the remaining portion of the inner inorganic layer.

17. The OLED display panel according to claim 16, wherein the at least one portion of the outer inorganic layer formed in the crack-proof recess is completely separated from the remaining portion of the outer inorganic layer.

18. The OLED display panel according to claim 11, wherein
a distance between the retaining wall and the crack-proof recess is greater than or equal to 5um,
a width of an opening end of the crack-proof recess near the barrier layer is less than a width of a bottom end of the crack-proof recess away from the barrier layer; and
the crack-proof recess cross-sectional contour is trapezoidal, a height of a cross-sectional contour of the crack-proof recess is greater than or equal to 2 um, and a minimum width W of the cross-sectional contour of the crack-proof recess is from 10 um to 30 um, an included angle $\theta$ between a leg of the cross-sectional contour of the crack-proof recess and a level line is from 0° to 90°.

19. The OLED display panel according to claim 18, wherein the barrier layer is an inorganic film layer, the underlay substrate comprises an organic film layer, and the crack-proof recess extends through the inorganic film layer and extends into the organic film layer.

20. The OLED display panel according to claim 19, wherein
the at least one portion of the inner inorganic layer formed in the crack-proof recess is completely separated from the remaining portion of the inner inorganic layer; and
the at least one portion of the outer inorganic layer formed in the crack-proof recess is completely separated from the remaining portion of the outer inorganic layer.

\* \* \* \* \*